United States Patent
Wada et al.

(10) Patent No.: US 6,933,185 B2
(45) Date of Patent: Aug. 23, 2005

(54) POLYSILICON EVALUATING METHOD, POLYSILICON INSPECTION APPARATUS AND METHOD FOR PREPARATION OF THIN FILM TRANSISTOR

(75) Inventors: Hiroyuki Wada, Kanagawa (JP); Yoshimi Hirata, Kanagawa (JP); Ayumu Taguchi, Tokyo (JP); Koichi Tatsuki, Kanagawa (JP); Nobuhiko Umezu, Kanagawa (JP); Shigeo Kubota, Kanagawa (JP); Tetsuo Abe, Kanagawa (JP); Akifumi Ooshima, Kanagawa (JP); Tadashi Hattori, Kanagawa (JP); Makoto Takatoku, Kanagawa (JP); Yukiyasu Sugano, Kanagawa (JP)

(73) Assignee: Sony Corporation, Tokyo (JP)

( * ) Notice: Subject to any disclaimer, the term of this patent is extended or adjusted under 35 U.S.C. 154(b) by 176 days.

(21) Appl. No.: 10/394,223

(22) Filed: Mar. 24, 2003

(65) Prior Publication Data

US 2003/0183853 A1 Oct. 2, 2003

Related U.S. Application Data

(62) Division of application No. 09/756,309, filed on Jan. 8, 2001, now abandoned.

(30) Foreign Application Priority Data

Jan. 7, 2000 (JP) .................................... P2000-005994
Jan. 7, 2000 (JP) .................................... P2000-005995
Jan. 7, 2000 (JP) .................................... P2000-005996

(51) Int. Cl.$^7$ ..................... C30B 28/02; H01L 21/786
(52) U.S. Cl. ..................... 438/166; 438/158; 438/487
(58) Field of Search ..................... 438/149–166, 438/482–487

(56) References Cited

U.S. PATENT DOCUMENTS

| | | | |
|---|---|---|---|
| 4,966,455 A | | 10/1990 | Avni et al. |
| 5,756,364 A | * | 5/1998 | Tanaka et al. ................. 438/30 |
| 5,825,498 A | | 10/1998 | Nuttall et al. |
| 5,843,811 A | | 12/1998 | Hummel et al. |
| 5,864,394 A | | 1/1999 | Jordan, III et al. |
| 5,946,562 A | | 8/1999 | Kuo |
| 6,136,632 A | | 10/2000 | Higashi |
| 6,555,423 B2 | * | 4/2003 | Wada et al. ................. 438/166 |

FOREIGN PATENT DOCUMENTS

WO      WO 97/23806 A      7/1997

OTHER PUBLICATIONS

European search report, regarding EP 01 10 0258, mailed Sep. 7, 2004.

* cited by examiner

*Primary Examiner*—Howard Weiss
*Assistant Examiner*—Marcos D. Pizarro
(74) *Attorney, Agent, or Firm*—Sonnenschein, Nath & Rosenthal LLP

(57) ABSTRACT

The state of a polysilicon film formed by excimer laser annealing an amorphous silicon film is to be evaluated. When the amorphous silicon film is annealed to form a polysilicon film, linearity or periodicity presents itself in the spatial structure of the film surface of the polysilicon film formed depending on the energy applied to the amorphous silicon during annealing. This linearity or periodicity is processed as an image and represented numerically from the image by exploiting the linearity or periodicity. The state of the polysilicon film is checked based on the numerical results.

4 Claims, 17 Drawing Sheets

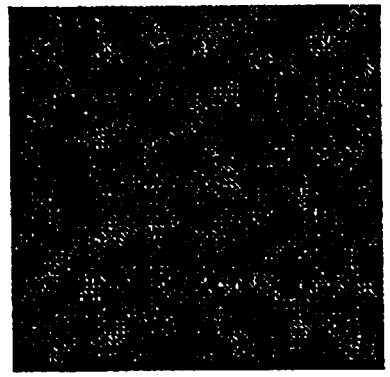
AC=9.1
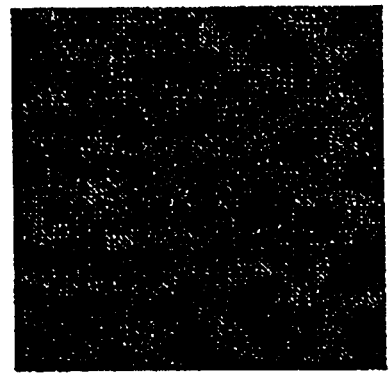
AC=30.4
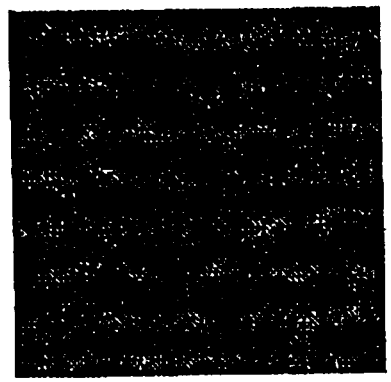
AC=63.0
FIG.12

POLYSILICON EVALUATING METHOD, POLYSILICON INSPECTION APPARATUS AND METHOD FOR PREPARATION OF THIN FILM TRANSISTOR

PRIORITY CLAIM

This application is a divisional of U.S. application Ser. No. 09/756,309, filed on Jan. 8, 2001, now abandoned, which claims priority from Japanese Patent Application Nos. P2000-005994, P2000-005995, and P2000-005996, all filed on Jan. 7, 2000, all of which are hereby incorporated by reference.

BACKGROUND OF THE INVENTION

1. Field of the Invention

This invention relates to a method for evaluating the state of a polysilicon film generated on annealing amorphous silicon, an inspection apparatus for inspecting a polysilicon film formed on annealing amorphous silicon, and a method for preparation of a thin-film transistor provided with a polysilicon film generated on annealing amorphous silicon. This invention also relates to a method for preparation of a thin-film transistor of a bottom gate structure in which a gate electrode is formed between a substrate and a polysilicon film.

2. Description of Related Art

Recently, a thin-film transistor employing a polysilicon film as a channel layer is being put to practical use. If polysilicon is used in the channel layer, electrical field mobility of the thin-film transistor is increased significantly. Thus, if the transistor is used as a driving circuit for e.g., a liquid crystal display, it is possible to realize high definition, high speed and a small size of the display.

Recently, the so-called low-temperature polycrystallization process of heat processing amorphous silicon to form a polysilicon film, using an excimer laser annealing device, has also been developed. By applying the low-temperature polycrystallization process to the production process for the thin-film transistor, it becomes possible to reduce thermal damages to a glass substrate to enable the use of an inexpensive heat-resistant glass substrate of a large surface area.

However, with an excimer laser annealing device, used in the low-temperature polycrystallization process, the grain size of the polysilicon generated is varied significantly because of the unstable output power. So, with the polysilicon film, formed using the excimer laser annealing device, an optimum grain size is not necessarily produced, thus occasionally producing rejects.

Thus, in the annealing employing this sort of the excimer laser annealing device, the state of crystals of the polysilicon film formed on the uppermost surface at a stage of completion of the polycrystallization process for the polysilicon film is checked by 100%-inspection or by random product sampling to check whether or not the product at this state is a reject. Also, the energy information furnished to the polysilicon film is fed back to the excimer laser annealing device to set an optimum laser power.

However, in evaluating a polysilicon film, there is no other method than a sensual method of photographing a surface image using a spectroscopic ellipsometric method or a scanning type electron microscope to view its surface image visually to verify the crystal state, while there lacks a method by non-contact objective check. Moreover, these methods are poor in efficiency as to time and cost and are difficult to use as an in-process method.

SUMMARY OF THE INVENTION

It is therefore an object of the present invention to enable the state of the polysilicon film formed to be evaluated objectively, accurately and automatically in a non-contact fashion.

For accomplishing the above object, the present inventors have conducted perseverant researches, and have found that, when an amorphous silicon film is annealed to form a polysilicon film, there is presented linearity and/or periodicity in the spatial structure of the polysilicon film surface, depending on the energy applied to the amorphous silicon film during this annealing, and that evaluation of this linearity and/or periodicity in the surface spatial structure is effective in evaluating the polysilicon film.

The present inventors have also found that the linearity and/or periodicity presented in the spatial structure of the film surface of the polysilicon film as a result of the annealing becomes maximum when a certain pre-set energy is applied, and that adjustment or control of the energy applied to the amorphous silicon film based on the energy which maximizes the linearity and/or periodicity on the spatial structure of the surface of the polysilicon film therefore is effective to optimize the characteristics of the polysilicon film.

Specifically, the present inventors have found that the linearity and/or periodicity presents itself in the spatial structure of a polysilicon film surface when polysilicon film as a channel of a thin-film transistor on the substrate is formed.

For example, if a thin-film transistor, whose channel is formed by polysilicon, is formed on a glass substrate, a polysilicon film is formed by forming a film of amorphous silicon and by laser annealing the resulting amorphous silicon film using excimer laser having a linear illuminating surface. In the laser annealing processing by the excimer laser, the light beam is moved in a direction perpendicular to the longitudinal direction of the linear illuminating surface as the hest energy is applied to the entire glass substrate surface.

The present inventors have found that micro-irregularities are formed on the surface of the polysilicon film produced in this manner by the excimer laser annealing, and that these micro-irregularities present periodicity in a direction perpendicular to the direction of the light beam movement.

The present inventors have found that evaluation of this linearity and/or periodicity is effective in evaluating whether or not the polysilicon film formed is usable as a thin-film transistor. The present inventors have also found that the result of evaluation of the linearity and/or periodicity can be effectively utilized in adjusting or controlling the excimer laser energy.

It is on the basis of the above information that the present inventors have arrived at the polysilicon evaluating method and the polysilicon inspection apparatus and method for preparation of thin film transistor of the present invention.

In one aspect, the present invention provides a method for evaluating a polysilicon film formed by annealing an amorphous silicon film, including evaluating the linearity and/or periodicity of a spatial structure of the film surface of the polysilicon film, and evaluating the state of the polysilicon film based on the result of evaluation of linearity and/or periodicity.

In this polysilicon film evaluating method, the polysilicon film generated on laser annealing the amorphous silicon film is evaluated.

In another aspect, the present invention provides an apparatus for inspecting a polysilicon film formed by annealing an amorphous silicon film, which includes means for observing the spatial structure of the surface of the polysilicon film and means for evaluating the linearity and/or periodicity of the spatial structure of the film surface of the polysilicon film acquired by the observing means to inspect the state of the polysilicon film based on the result of evaluation of the linearity and/or periodicity.

In this polysilicon inspecting apparatus, the polysilicon film generated on laser annealing the amorphous silicon film is evaluated.

In still another aspect, the present invention provides a method for preparation of a thin-film transistor which includes the steps of forming an amorphous silicon film, annealing the formed amorphous silicon film to form a polysilicon film, and evaluating the linearity and/or periodicity of the spatial structure of the film surface of the polysilicon film to evaluate the state of the polysilicon film based on the result of evaluation of linearity and/or periodicity.

In this method for producing a thin-film transistor, the polysilicon film generated on laser annealing the amorphous silicon film is evaluated.

In still another aspect, the present invention provides a method for preparation of a thin-film transistor having a step of forming a polysilicon film serving as a channel layer by laser annealing an amorphous silicon film by an excimer laser annealing device which includes the steps of forming a gate electrode on a substrate, forming an amorphous silicon film on the substrate on which the gate electrode has been formed, laser annealing the amorphous silicon films on plural substrates or plural locations of the amorphous silicon film on a sole substrate to form a polysilicon film, evaluating the linearity and/or periodicity of a spatial structure of a surface of the polysilicon film formed on the gate electrode on the substrate, evaluating the linearity and/or periodicity of the spatial structure of the surface of the polysilicon film formed on locations other than the gate electrode on the substrate, calculating the manufacturing margin of the polysilicon film in the laser annealing based on the linearity and/or periodicity of the spatial structure of the polysilicon film surface formed on the gate electrode and on the linearity and/or periodicity of the polysilicon film surface formed on a location other than the gate electrode, and setting the laser power of the excimer laser annealing device based on the manufacturing margin.

In this method for preparation of a thin-film transistor, the polysilicon film generated on laser annealing the amorphous silicon film is evaluated.

In yet another aspect, the present invention provides a method for preparation of a thin-film transistor of a bottom gate structure in which a gate electrode is formed between a substrate and a polysilicon film which includes the steps of forming a gate electrode on the substrate, forming an amorphous silicon film on the substrate on which the gate electrode has been formed, laser annealing the amorphous silicon film to form a polysilicon film, and checking the acceptability of the polysilicon film based on a spatial structure of the surface of the polysilicon film. The checking step includes evaluating the linearity and/or periodicity of the spatial structure of the surface of the polysilicon film formed on the gate electrode of each substrate, evaluating the linearity and/or periodicity of the spatial structure of the surface of the polysilicon film formed on a location other than the gate electrode of each substrate, and checking the acceptability of the polysilicon film based on the linearity and/or periodicity of the spatial structure of the surface of the polysilicon film formed on the gate electrode or on the linearity and/or periodicity of the spatial structure of the surface of the polysilicon film formed on a location other than the gate electrode. In this method for preparation of a thin-film transistor of the bottom gate structure, the polysilicon film generated on laser annealing the amorphous silicon film is evaluated.

In the polysilicon evaluating method and in the polysilicon inspection apparatus, according to the present invention, in which linearity and/or periodicity of the spatial structure of the polysilicon film formed on annealing is evaluated, polysilicon evaluation or inspection can be achieved readily non-destructively, whilst the numerical computation is feasible without visual inspection, thus assuring automatic evaluation. Moreover, subjective evaluation can be achieved with high accuracy.

In the method for preparing a thin-film transistor, in which linearity and/or periodicity of the spatial structure of the polysilicon film, formed by annealing, is evaluated, polysilicon inspection can be made readily non-destructively, whilst the inspection process can be built into the manufacturing process. Moreover, the numerical computation is feasible without visual inspection, thus assuring automatic evaluation, whilst subjective evaluation can be achieved with high accuracy. In addition, the results of inspection can be fed back to the annealing process to raise the production yield of the thin-film transistor by this method.

BRIEF DESCRIPTION OF THE DRAWINGS

FIG. 12 illustrates AC values as found for a specified image.

FIG. 25 illustrates typical results of the above check on plural LCDs formed on a glass substrate.

DESCRIPTION OF THE PREFERRED EMBODIMENTS

Figure 1:
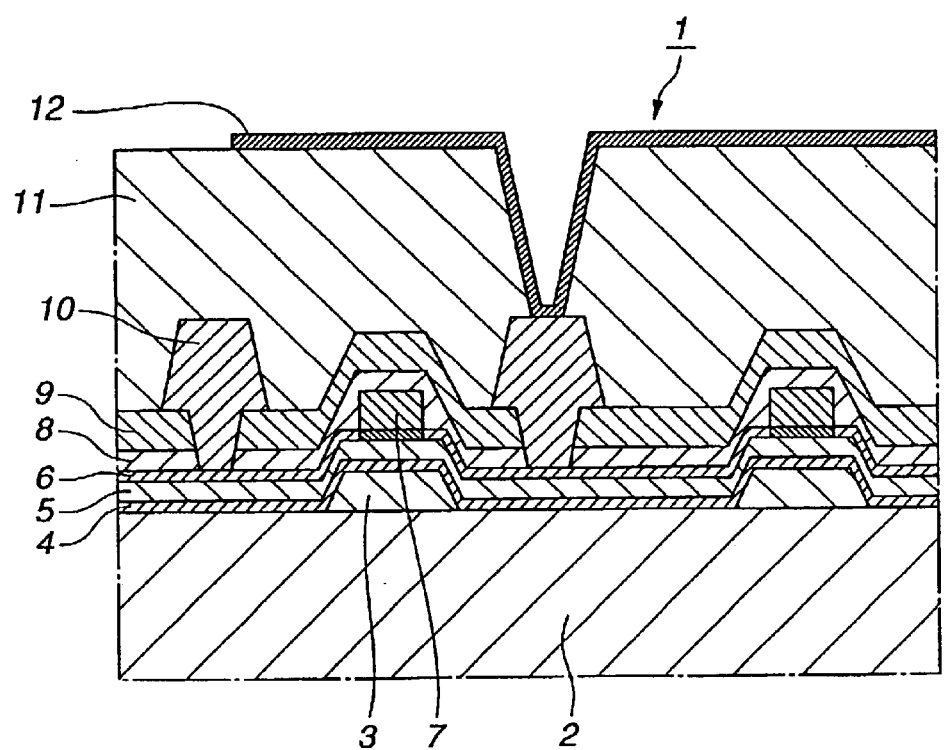
FIG. 1 illustrates a schematic cross-sectional structure of a bottom gate type TFT.

Referring to the drawings, preferred embodiments of a polysilicon film evaluation device according to the present invention will be explained in detail.

The polysilicon film evaluation device of the present embodiment is used for inspecting the polysilicon film formed in the production process of a thin-film transistor having bottom gate structure (bottom gate type TFT). The bottom gate type TFT is a thin-film transistor in which a gate electrode, a gate insulating film and a polysilicon film (channel layer) are formed sequentially from the lower layer side on e.g., a glass substrate. That is, the bottom gate type TFT is such a TFT in which a gate electrode is formed between the polysilicon film as a channel layer and a glass substrate.

Structure of Bottom Gate Type TFT

A bottom gate type TFT 1 is comprised of a glass substrate 2 on which are layered a gate electrode 3, a first gate insulating film 4, a second gate insulating film 5, a polysilicon film 6, a stop 7, a first interlayer insulating film 8, a second interlayer insulating film 9, a wiring 10, a planarizing film 11 and a transparent electrically conductive film 12, as shown in FIG. 1.

The gate electrode 3 is formed by depositing molybdenum (Mo) to a thickness of 50 to 300 nm on the glass substrate 2 and by subsequent patterning by anisotropic etching.

The first gate insulating film 4 is a silicon nitride ($SiN_x$) film, e.g., 50 nm in thickness. On the glass substrate 2, carrying this gate electrode 3, is layered silicon nitride $SiN_x$.

The second gate insulating film 5 is formed e.g., of silicon dioxide ($SiO_2$), e.g., 120 nm in thickness, this silicon dioxide ($SiO_2$) being layered on the first gate insulating film 4.

The polysilicon film 6 is formed e.g., of polysilicon (p-Si) 40 nm in thickness. This polysilicon film 6 is layered on the second gate insulating film 5. This polysilicon film 6 operates as a channel layer of the bottom gate type TFT 1. This polysilicon film 6 is formed on polycrystallization by annealing amorphous silicon (a-Si) formed to a thickness of 40 nm by e.g., the LPCVD method. In the polycrystallization process for the polysilicon film 6, laser annealing processing employing an excimer laser as a UV laser is used. In this excimer laser annealing processing, a pulsed light beam having a linear irradiating surface is radiated and the amorphous silicon is polycrystallized to polysilicon as the illumination area of the pulsed beam is moved. The illuminating surface of the light beam has a length in the longitudinal direction of 20 cm and a length along its short side of 400 μm, with the pulse frequency being 300 Hz. The scanning direction of the light beam in excimer laser annealing is perpendicular to the longitudinal direction of the illuminating surface of the linear laser, that is the short side direction.

The polysilicon film 6 is first polycrystallized by excimer laser annealing and subsequently doped with impurity ions to form a source/drain area. This ion doping is executed after forming a stop 7 at a position where the gate electrode 3 is formed, in order to prevent impurities from being implanted on the polysilicon film 6 overlying the gate electrode 3. This stop 7 is formed of silicon dioxide ($SiO_2$) with a film thickness of 200 nm and is formed using a mask used in forming the gate electrode 3.

The first interlayer insulating film 8 is formed by silicon nitride ($SiN_x$) with a film thickness e.g., of 300 nm, this silicon nitride ($SiN_x$) being layered on the polysilicon film 6.

The second interlayer insulating film 9 is formed of silicon dioxide ($SiO_2$) with a film thickness e.g., of 150 nm, this silicon dioxide ($SiO_2$) being layered on the first interlayer insulating film 8.

The wiring 10 is formed by depositing aluminum (Al) and titanium (Ti), after providing a contact hole for connection to a source/drain area of the polysilicon film 6 at a location corresponding to a source/drain area of the first interlayer insulating film 8 and the second interlayer insulating film 9, and by patterning on etching. This wiring 10 interconnects the source/drain area of each transistor formed on the polysilicon film 6 to form a pre-set circuit pattern on the substrate.

The planarizing film (HRC) 11 is a film for planarizing the surface of the bottom gate type TFT 1 and is formed to a film thickness of 2 to 3 μm after depositing the wiring 10.

The transparent electrically conductive film 12 is of a transparent electrically conductive material, such as, for example, ITO, and is an electrically conductive line for interconnecting the wiring 10 to an external element or wiring present externally of the bottom gate type TFT 1. This transparent electrically conductive film 12 is formed on the planarizing film 11 after boring the contact hole in the planarizing film 11.

In the above-described bottom gate type TFT 1, in which polysilicon is used for the channel layer, the electrical field mobility of the channel field is increased appreciably. So, if the bottom gate type TFT 1 is used as e.g., a driving circuit for the liquid crystal display, it is possible to realize refinement, high speed and size reduction of the display. Moreover, in the above-mentioned bottom gate type TFT 1, the so-called low-temperature polycrystallization process, in which amorphous silicon is heat-treated using excimer laser annealing to form the polysilicon film 6. The result is that the thermal damage to the glass substrate 2 in the polycrystallization process is diminished to render possible the use of an inexpensive heat-resistant large-area glass substrate.

Necessity of Inspection of Polysilicon Film

Meanwhile, it is said that the grain size of polysilicon represents a critical factor governing the electrical field mobility of the polysilicon film 6. The grain size depends appreciably on the energy applied to the polysilicon film 6 at the time of excimer laser annealing. So, the laser power control and stabilization at the time of excimer laser annealing influence the characteristics and the yield of production of the completed bottom gate type TFT 1 significantly.

However, with the excimer laser annealing device, used in the excimer laser annealing, the radiated laser power undergoes marked output fluctuations. Therefore, if excimer laser annealing is performed using the excimer laser annealing device, there results significant variation in the energy applied to the polysilicon film 6 as compared with the allowed energy range which yields a satisfactory grain size, that is the manufacturing margin for the polysilicon film 6 is increased, to render stable preparation of the polysilicon film 6 difficult.

So, even if excimer laser annealing is performed under the same condition, the grain size of the polysilicon film 6 is varied significantly. For example, if the laser power is increased excessively, silicon crystals are comminuted to cause so-called linear defects. If conversely the laser power is excessive, there result so-called writing defects such that sufficiently large grain size is not obtained.

Moreover, in the bottom gate type TFT, in which the gate electrode 3 is disposed as an underlying layer with respect to the polysilicon film 6, heat dissipation on laser annealing is larger for the polysilicon film 6 on the gate electrode 3 than that for the polysilicon film 6 on the glass substrate 2 (on the source/drain region). So, even if laser power applied from the excimer laser annealing device is the same, the temperature rising rate for the portion of the polysilicon film 6 lying on the gate electrode 3 differs from that for the portion of the polysilicon film 6 lying on the glass substrate 2 (on the source/grain region) thus giving rise to different grain size. Specifically, with the same laser power, the grain size on the portion of the polysilicon film 6 lying on the gate electrode 3 is smaller than that on portion of the polysilicon film 6 lying on the glass substrate 2.

Thus, in the bottom gate type TFT, such an energy needs to be afforded by the excimer laser which will give a grain size optimum for both the portion of the polysilicon film 6 lying on the glass substrate 2 and the portion of the polysilicon film 6 lying on the gate electrode 3, so that there results only extremely narrow production margin of the polysilicon film 6.

However, the excimer laser annealing device used in the excimer laser annealing as described above undergoes larger laser power output fluctuations, so that it is difficult to control the laser power so that the grain size for the portion of the polysilicon film 6 lying on the glass substrate 2 and that for the portion of the polysilicon film 6 lying on the gate electrode 3 will be optimum.

Figure 2:
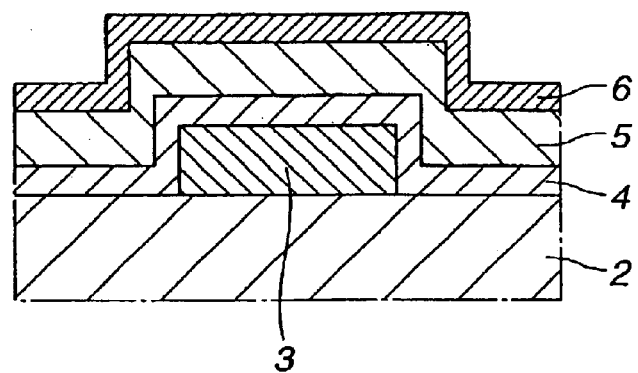
FIG. 2 illustrates a cross-sectional structure of a bottom gate type TFT following formation of a polysilicon film.

So, if annealing is to be performed using such excimer laser annealing device, the 100% inspection of the state of the crystals of the polysilicon film 6 formed on the uppermost surface of the polysilicon film 6 is performed when the polycrystallization process of the polysilicon film 6 is completed, as shown for example in FIG. 2, or inspection is performed on products sampled at random, to check whether or not the manufactured products are rejects. Alternatively, the information on the energy applied to the polysilicon film 6 is fed back to the excimer laser annealing device to set the laser power.

The polysilicon film evaluation device embodying the present invention is used for evaluating the polysilicon film at a stage when the polycrystallization process for the polysilicon film 6 is completed, to check whether or not the obtained product at this stage is a reject, and for feeding back the information to the excimer laser annealing device to set the laser energy:

Principle and Technique of Evaluation of Polysilicon Film (1) First, the principle of evaluation of the polysilicon film formed by the above-described excimer laser annealing is explained.

The mobility of the thin-film transistor is influenced appreciably by the polysilicon grain size, as discussed above. For realizing sufficient mobility, a larger polysilicon grain size is preferred.

Figure 3:
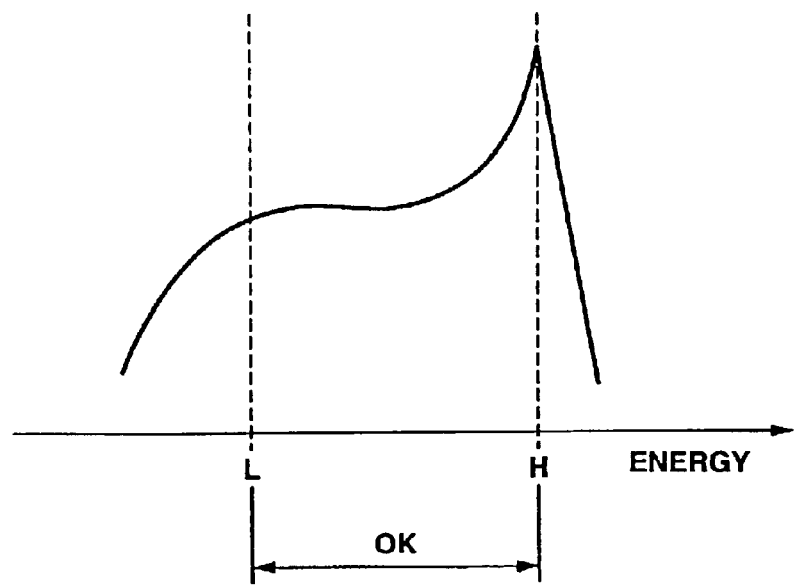
FIG. 3 illustrates the relation between the grain size of a polysilicon film and the energy furnished by excimer laser annealing.

The grain size of the polysilicon film depends appreciably on the energy applied in the excimer laser annealing. Referring to FIG. 3, the grain size of the polysilicon film increases with increasing energy applied. When reaching or exceeding a pre-set energy indicated by L in the drawing, variation in the grain size becomes smaller and stabilized. The energy L is referred to as the minimum allowed energy. If the energy is increased further, the change in the grain size is increased, with the polysilicon proving micro-sized grains with a certain threshold value indicated H in the drawing as a boundary. This energy is referred to as the maximum allowed energy H.

So, if excimer laser annealing is to be performed, the illuminated laser power is controlled to be in a range from the minimum allowed energy L, where the grain size is becoming stabilized, up to the maximum allowed energy H directly before the grain size proves the micro-sized grains. By radiating the laser light of the laser power affording this range of energy to the amorphous silicon film, it is possible to sufficiently increase the mobility of the completed thin-film transistor.

Figure 4C:
FIG. 4 illustrates an image on the surface of a polysilicon film when excimer laser annealing is performed with an optimum laser power value, an image on the surface of a polysilicon film when excimer laser annealing is performed with a power smaller than the optimum laser power value and an image on the surface of a polysilicon film when excimer laser annealing is performed with a power larger than the optimum laser power value.
Figure 4B:
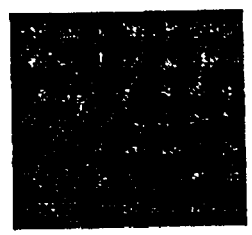
Figure 4A:

(2) Next, in the excimer laser annealing, an image on a film surface of the polysilicon film, with the laser power set to an optimum value, an image on a film surface of the polysilicon film, with the laser power set to a value smaller than the optimum value, and an image on a film surface of the polysilicon film, with the laser power set to a value larger than the optimum value, are compared to one another. FIGS. 4A to 4C show these respective images. Specifically, FIG. 4A shows the image on a film surface of the polysilicon film, with the laser power set to an optimum value, FIG. 4B shows the image on a film surface of the polysilicon film, with the laser power set to a value smaller than the optimum value, and FIG. 4C shows the image on a film surface of the polysilicon film, with the laser power set to a value larger than the optimum value. It is noted that the images shown in FIG. 4 are those photographed with a microscopic device employing UV light. This microscopic device will be explained in detail subsequently.

In FIG. 4, the laser scanning direction in the excimer laser annealing is the direction X in the drawing. Meanwhile, the amorphous silicon film is irradiated with a light beam having a linear irradiating surface, with the laser light scanning direction being perpendicular to the longitudinal direction of the laser beam irradiating surface.

On comparison of the image of FIG. 4B, with the laser power in the excimer laser annealing set to the optimum value, to the images of FIGS. 4A and 4C, the following characteristics are noticed.

First, the surface image of the polysilicon film with the laser power set to its optimum value (FIG. 4B) exhibits linearity as compared to the surface images of the polysilicon film with the laser power not set to its optimum value (FIGS. 4A and 4C). Specifically, the surface image of FIG. 4B exhibits linearity with respect to the laser scanning direction, indicated by X in FIG. 4. That is, the polysilicon film surface, with the laser power set to the optimum value, has a characteristic linear shape exhibiting linearity in its spatial structure.

Also, the surface image of the polysilicon film with the laser power set to its optimum value (FIG. 4B) exhibits periodicity as compared to the surface images of the polysilicon film with the laser power not set to its optimum value (FIGS. 4A and 4C). Specifically, the surface image of FIG. 4B exhibits periodicity in the direction perpendicular to the laser scanning direction (indicated by arrow Y in FIG. 4). That is, the surface image of the polysilicon film with the laser power set to its optimum value has a characteristic linear shape exhibiting linearity in its spatial structure.

So, the polysilicon film evaluating device embodying the present invention checks the polysilicon film state by exploiting the above-described characteristics. That is, the polysilicon film evaluating device embodying the present invention performs numerical analysis of the surface image of the polysilicon film following excimer laser annealing to check whether the surface spatial structure of the polysilicon film exhibits periodicity, whether the surface spatial structure of the polysilicon film exhibits linearity or whether the surface spatial structure of the polysilicon film exhibits both linearity and periodicity, in order to inspect the state of the polysilicon film of the bottom gate type TFT.

(3) Next, the typical technique for numerical processing in case the photographed image of the polysilicon film exhibits linearity, periodicity or both linearity and periodicity is explained.

If the photographed image of the polysilicon film exhibiting both the linearity and periodicity is represented schematically, it may be represented as having numerous straight lines arranged parallel to and at an equal spacing to one another. If the photographed image of the polysilicon film not exhibiting linearity nor periodicity is represented schematically, it may be represented as having irregular short lines appearing irregularly. For numerically representing the and evaluating linearity and periodicity from these images, it is sufficient if a given image is translated in a direction having the assumed periodicity and in a perpendicular direction thereto and correlation of the translated image is evaluated numerically. For example, if an image exhibiting linearity and periodicity is translated, there is presented an image with a high correlation, that is with a higher rate of image superposition. If conversely an image exhibiting no linearity nor periodicity is translated, there is presented no highly correlated image, that is, there is presented no image with a high rate of image superposition, at a pre-set period.

By employing the concept of numerically representing image correlation, in case the image is translated, it becomes possible to numerically represent and evaluate the polysilicon film periodicity. As a specified method for realizing this technique, there is such a method of finding the autocorrelation function of an image, calculating peak and side peak values of the autocorrelation function and taking the ratio of the so-calculated peak and side peak values. The peak values herein mean the value at the point of origin less the second smallest value from the point of origin in the y-direction. It is noted that this second smallest value is used to diminish the value of defocussing and may be replaced by the smallest value or the third smallest value, fourth smallest value and so on, and that the side peak value is the second locally largest value in the y-direction from the point of origin, excluding the point of origin, less the second locally smallest value in the y-direction from the point of origin.

According to the present invention, it is also possible to evaluate one of the linearity and periodicity to evaluate the state of the polysilicon film.

As another technique for numerical processing in case the photographed image of the polysilicon film exhibits linearity and/or periodicity, there is such a technique of summing the values of the totality of pixels in the generally linear direction of a standardized image to find the modulation factor. There are also known a technique of processing a standardized image with two-dimensional Fourier transform to find the amplitude of a certain frequency component, a technique of extracting coordinates of extreme values (locally minimum or locally maximum values) in an image, such as an image supposed to exhibit linearity in the y-direction, and taking a variance in the x-direction with respect to a coordinate in an oblong range along the y-direction in which the center in the x-direction is taken at the extreme value x average coordinate value and the length in the x-direction is taken as a pitch in the array in the x-direction, and a technique of extracting coordinates of extreme values (locally minimum or maximum values) within an image assumed to exhibit linearity in e.g., the y-direction and taking an angle with upper and lower neighborhood points of each point with respect to the coordinate in an oblong range in the y-direction in which the center in the x-direction is taken at the extreme value x average coordinate value and the length in the x-direction is taken as a pitch in the array in the x-direction.

Specified Structure and Processing Contents of Polysilicon Film Evaluation Apparatus (1) The specified structure of a polysilicon film evaluation apparatus for evaluating the linearity and periodicity of the surface spatial structure of the polysilicon film described above is hereinafter explained.

The polysilicon film evaluating apparatus embodying the present invention is such a device in which a production substrate of a bottom gate type TFT, that is a substrate obtained directly after formation of the polysilicon film on excimer laser annealing an amorphous silicon film, is imaged by a microscopic device employing a UV light laser with a wavelength of 266 nm, and the state of the polysilicon film formed is evaluated from the photographing image.

Figure 5:
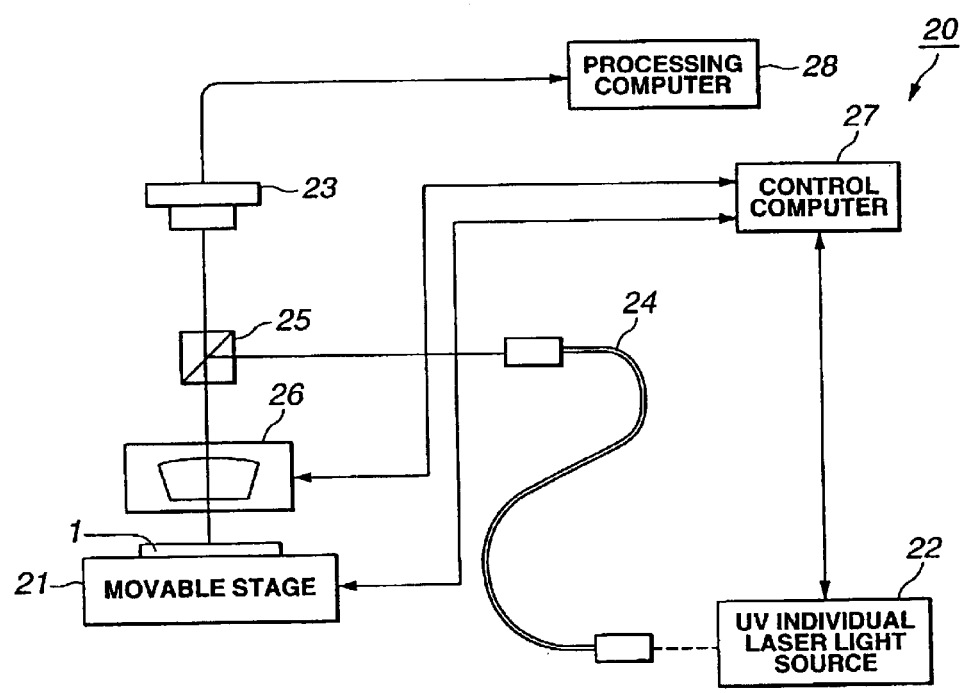
FIG. 5 is a schematic view of a polysilicon film evaluation device embodying the present invention.
Figure 6:
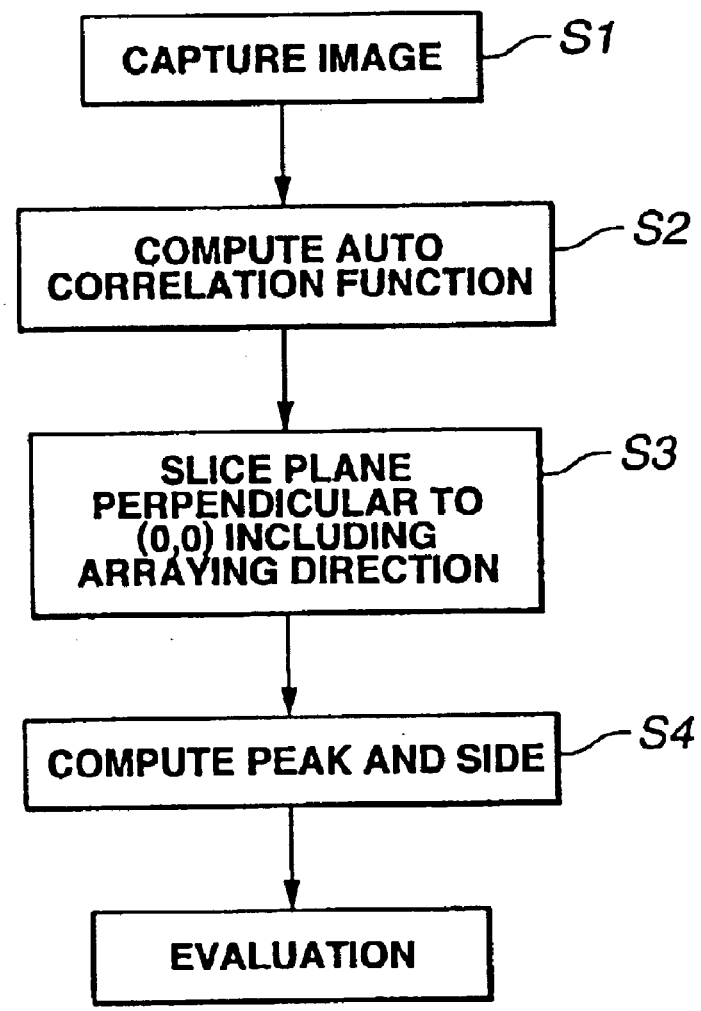
FIG. 6 is a flowchart for illustrating an evaluation sequence of a polysilicon film.

FIG. 5 shows a configuration of a polysilicon film evaluation apparatus embodying the present invention.

A polysilicon film evaluation apparatus 20 shown in FIG. 5 includes a movable stage 21, a UV solid laser light source 22, a CCD camera 23, an optical fiber probe 24, a beam splitter 25, an objective lens 26, a control computer 27 and a picture processing computer 28.

The movable stage 21 is a stage for supporting a substrate 1 on which has been formed a polysilicon film being inspected. This movable stage 21 has the functions of supporting the substrate 1 being inspected and of transporting the substrate 1 being inspected to a pre-set inspection position.

Specifically, the movable stage 21 includes an X-stage, a Y-stage, a Z-station and a suction plate.

The X- and Y-stages are stages movable in the horizontal direction. By these X- and Y-stages, the substrate 1 to be inspected is moved to a pre-set inspecting position. The Z-stage is a stage moved in the vertical direction for adjusting the stage height. The suction plate is used for immobilizing the substrate 1 being inspected by suction.

The UV solid laser light source 22 is a UV light source with a wavelength of 266 nm and uses e.g., a Nd:YAG fourth harmonics full-solid laser. Meanwhile, a UV laser light source with a wavelength of the order of 166 nm, recently developed, may also be employed.

The CCD camera 23, which is a camera highly sensitized with respect to UV light and has a CCD image sensor as an internal imaging device, images the surface of the substrate 1 by this CCD image sensor. This CCD camera 23 has its main body portion cooled to suppress the thermal noise, readout noise or the circuit noise generated in e.g., the CCD image sensor.

The optical fiber probe 24 is a waveguide channel for the UV laser light for guiding the UV laser light radiated from the UV solid laser light source 22 to the beam splitter 25.

The beam splitter 25 reflects the UV laser light from the UV solid laser light source 22 to illuminate the reflected light through the objective lens 26 onto the substrate 1 on the movable stage 21. On the other hand, the beam splitter 25 transmits the reflected from the substrate 1 to illuminate the transmitted light on a high sensitivity low noise camera 3. That is, the beam splitter 25 is a laser light separator for separating the optical path of the optical system of the light radiated from e.g., the UV solid laser light source 22 from the optical path of the optical system of the reflected light to the CCD camera 23.

The objective lens 26 is an optical component for enlarging the reflected light from the substrate 1 to detect the enlarged light. This objective lens 26 has the NA of 0.9 and a wavelength of 266 nm, and is corrected for aberration. The objective lens 26 is arranged between the beam splitter 25 and the movable stage 21.

The control computer 27 is responsible for lighting control of the laser light of the UV solid laser light source 22, movement position control of the movable stage 21 and switching control of the objective lens 26.

The picture processing computer 28 is responsible for capturing and analysis of an image of the substrate 1 photographed by the CCD image sensor provided on the CCD camera 23 and for evaluation of the polysilicon film formed on the substrate 1.

In the above-described evaluation apparatus 20, the UV laser light radiated from the UV solid laser light source 22 is illuminated on the substrate 1 through the optical fiber probe 24, beam splitter 25 and the objective lens 26. The UV laser light radiated on the substrate 1 is reflected by the surface of the substrate 1. The reflected light falls on the CCD camera 23 through the objective lens 26 and the beam splitter 25. The CCD camera 23 images the incident reflected light by the image sensor to route the surface image information of the polysilicon film, obtained on imaging, to the picture processing computer 28.

The picture processing computer 28 evaluates the state of the polysilicon film, based on the information on the surface image of the captured polysilicon film, in a manner as hereinafter explained. Based on the result of evaluation, the picture processing computer 28 finds setting values of the laser power at the time of excimer laser annealing aimed at generating the polysilicon film, or checks whether or not the polysilicon film formed on the substrate 1 is acceptable.

(2) The evaluation sequence of the state of the polysilicon film by the picture processing computer 28 is hereinafter explained. This picture processing computer 28 finds a value obtained on numerical representation of the periodicity using autocorrelation from the surface image of the polysilicon film. This value is referred to below as an AC value. The picture processing computer 28 then evaluates the linearity and periodicity of the spatial structure of the polysilicon film surface to evaluate the state of the polysilicon film.

As for the evaluation sequence, a picture on the surface of the polysilicon film is captured at step S1. The autocorrelation function then is calculated from the captured image at step S2. Then, a surface perpendicular to the arraying direction including the (0, 0) on the image coordinate is sliced at step S3. The peak and side peak values of the autocorrelation function on the slicing plane were then calculated and the ratio of the peak value and the side peak values was taken to find the AC value at step S4. Based on this AC value, the polysilicon film was evaluated at step S4.

The autocorrelation function is a function shown by the following equation:

$$R(\tau) \lim_{r \to \infty} \int_0^T f(x) f(x+\tau) dx$$

This autocorrelation function R(ô) is a function representing the correlation when a certain function f(x) is translated by ô in the x-direction.

This polysilicon film evaluation apparatus 20 finds the autocorrelation of the surface picture of the polysilicon film using the following Winner-Hintin theorem. Here, the image information specifically captured is termed "iii".

①  The captured image "iii" is two-dimensional Fourier transformed
:f=fourier(iii)

② The Fourier series "iii" is multiplied by itself to generate a power spectrum "ps".
:ps=$|f|^2$ ③ The power spectrum "ps" is inverse Fourier transformed to generate two-dimensional autocorrelation function "ac".

④ An absolute value of the autocorrelation function "ac" is taken to find a real number of the autocorrelation function "aca".
:aca=|ac|

Figure 7:
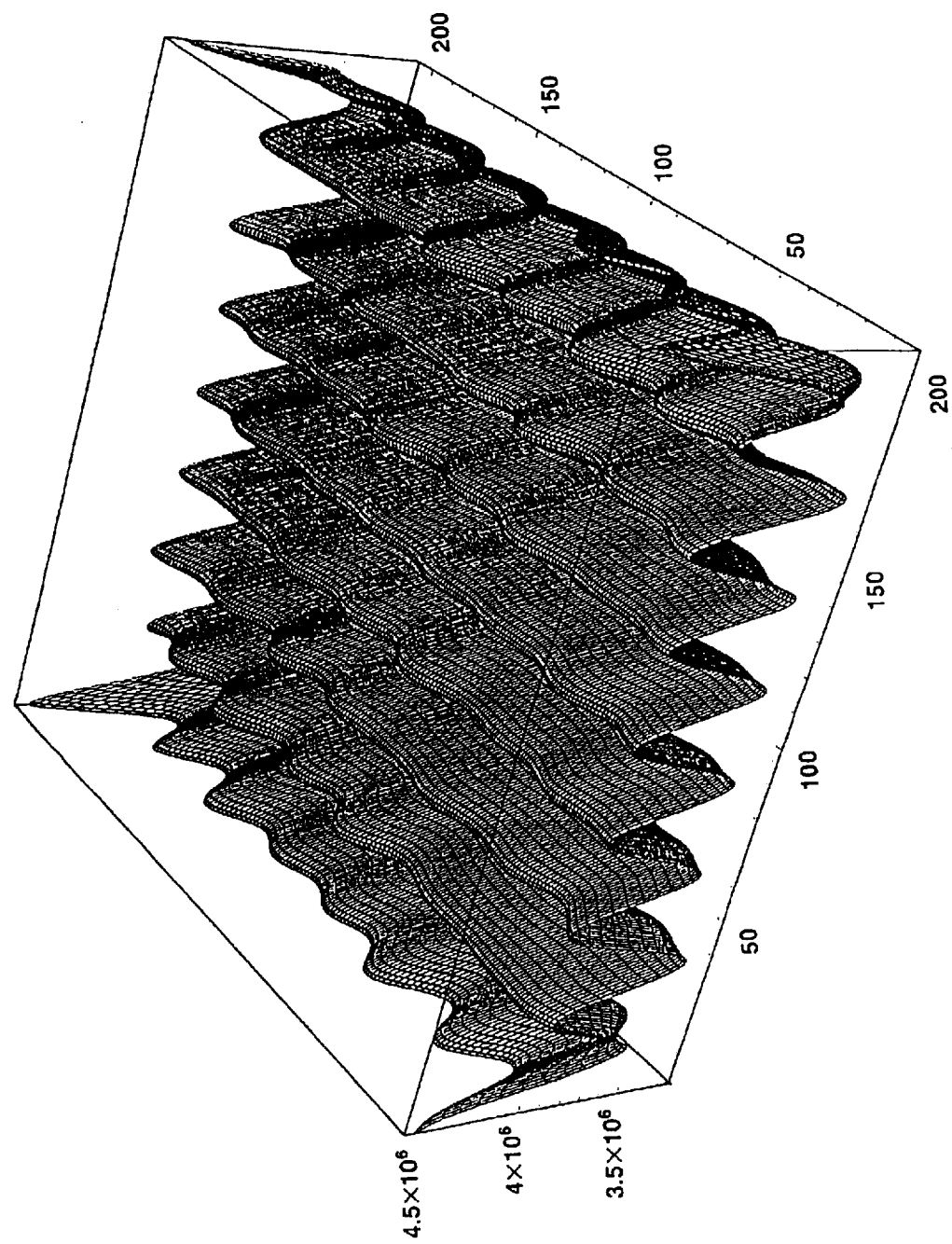
FIG. 7 illustrates an autocorrelation image for high periodicity.
Figure 8:
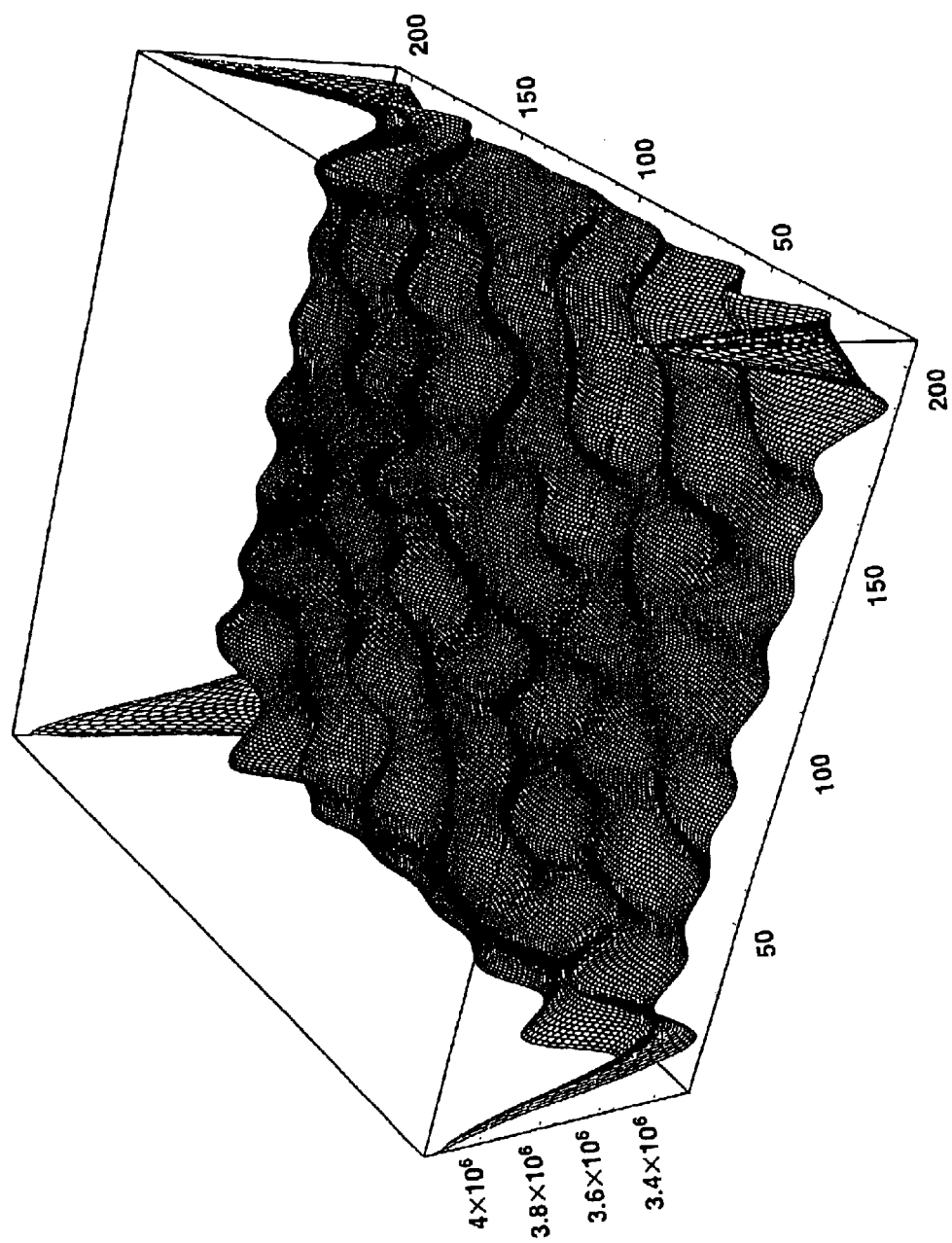
FIG. 8 illustrates an autocorrelation image for high periodicity.

If the so-generated autocorrelation function "aca" is displayed on a graph, it is a function shown in FIGS. 7 and 8. FIG. 7 shows an autocorrelation function for an image exhibiting high autocorrelation, that is a spatial structure of the polysilicon film surface exhibiting high periodicity and linearity. On the other hand, FIG. 8 shows an autocorrelation function for an image exhibiting low autocorrelation, that is a surface spatial structure of the polysilicon film exhibiting poor periodicity and linearity.

The polysilicon film evaluation apparatus 20 slices a plane perpendicular to the arraying direction, that is the linearity exhibiting direction, and which comprehends coordinate values (0, 0) on an image surface, from the autocorrelation function calculated using this Winner-Hintin theorem, to find a function obtained on slicing. The plane comprehending coordinate values (0, 0) on an image surface is sliced to standardize the value from the autocorrelation function varied with experimental parameters such as the volume of the illuminated light or CCD gain.

The function obtained on this slicing is the above-mentioned autocorrelation function R(ô) in a direction perpendicular to the arraying direction.

It is also possible to carry out the steps S1 to S3 as S11 to S14.

Figure 9:
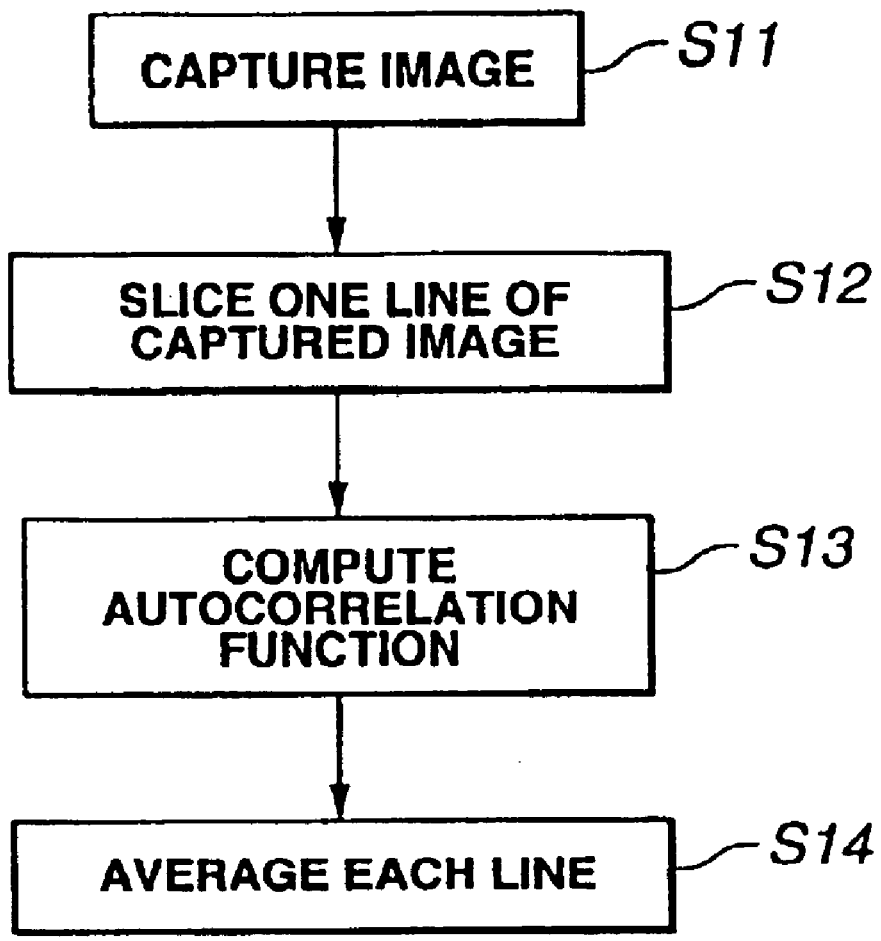
FIG. 9 is a flowchart for illustrating an evaluation sequence of a polysilicon film.

The processing sequence for this evaluation is shown in the flowchart of FIG. 9. First, an image on the polysilicon film surface is captured at step s11. Then, a line of the captured image in a direction (periodicity exhibiting direction: y-direction) perpendicular to the proceeding direction of the light beam (linearity exhibiting direction: x-direction) is sliced at step S12. The autocorrelation function for this one line is then calculated at step S13. The above-described operations are repeated several times, as necessary, at step S14, to effect averaging in each line.

The autocorrelation function may be found using the Winner-Hintin theorem as follows:

① The one line "1" of the captured image is Fourier-transformed.
:f1=fourier(iii)

② The Fourier series "f1" is multiplied by itself to generate a power spectrum "ps1".
:ps1=$|f1|^2$ ③ The power spectrum "ps1" is inverse-Fourier-transformed to generate two-dimensional autocorrelation function "ac1".
:ac1=inversefourier (ps1)

④ An absolute value of the autocorrelation function "aca1".
:aca1=|ac1| where the image information for one actually captured line is set to "1".

Figure 10:
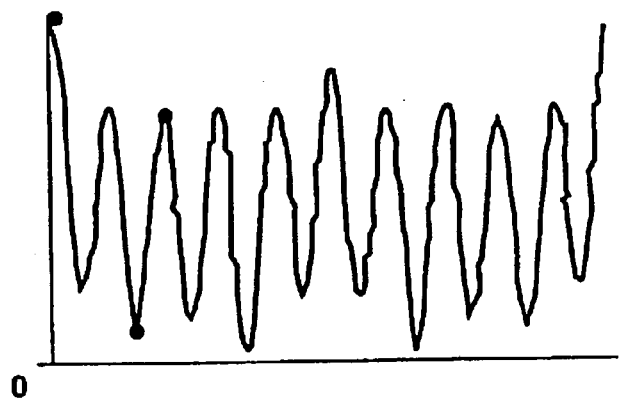
FIG. 10 illustrates an autocorrelation image for high periodicity in case of evaluation by the other polysilicon film.
Figure 11:
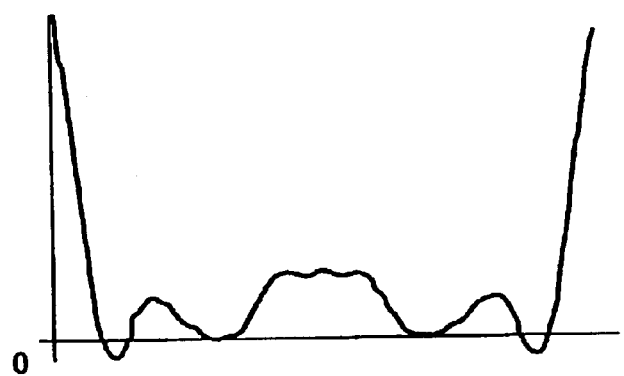
FIG. 11 illustrates an autocorrelation image for low periodicity in case of evaluation by the other polysilicon film.

If the so-generated autocorrelation function "aca1" is displayed on a graph, it is a function shown in FIGS. 10 and 11. FIG. 10 shows an autocorrelation function for an image exhibiting high autocorrelation, that is a surface spatial structure of the polysilicon film exhibiting high periodicity and linearity. On the other hand, FIG. 11 shows an autocorrelation function for an image exhibiting low autocorrelation, that is a surface spatial structure of the polysilicon film exhibiting poor periodicity and linearity.

The polysilicon film evaluation apparatus 20 then finds locally maximum peak and side peak values from the produced function. Then, it finds the ratio of the locally maximum value to the side peak value. The resulting ratio is an AC value.

Therefore, if a given image has high autocorrelation, that is if the surface spatial structure of the polysilicon film has high periodicity and linearity, the difference between the locally maximum peak value and side peak value is increased, so that the AC value is increased. If conversely the image has low autocorrelation, that is if the surface spatial structure of the polysilicon film has low periodicity and linearity, the difference between the locally maximum peak value and side peak value is decreased, so that the AC value is decreased.

The bottom gate type TFT 1 thus photographs the surface image of the polysilicon film and finds the autocorrelation function of the photographed image to achieve numerical representation of the linearity and periodicity of the polysilicon film.

Specifically, the AC value with respect to an illustrative photographed image is as shown in FIG. 12.

(3) The relation between the AC value obtained by the above calculations, the grain size of the polysilicon film and the energy applied to the polysilicon film is hereinafter explained.

Figure 13:
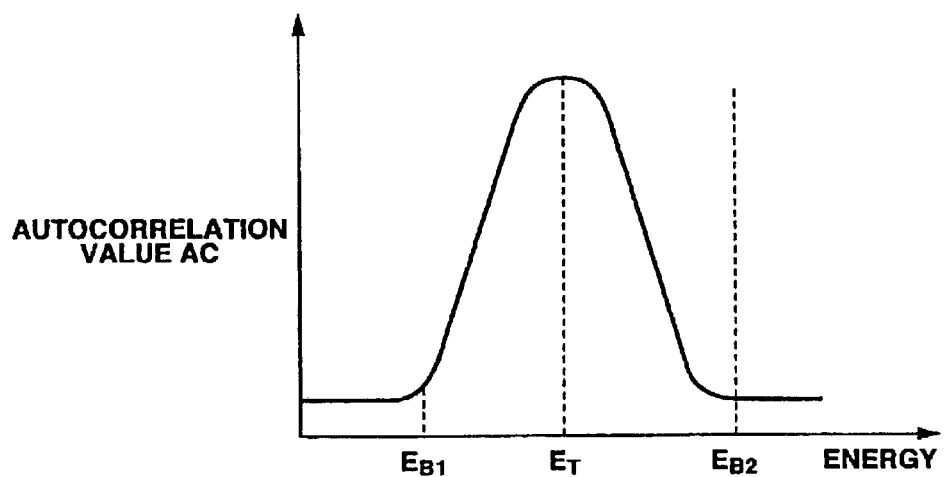
FIG. 13 illustrates autocorrelation values for the energy applied to a polysilicon film.

Referring to FIG. 13, the AC value is increased proportionally as from a time point when the energy applied to the polysilicon film by excimer laser annealing reaches a certain energy EB1, with the AC value becoming maximum at a certain energy ET. The AC value is at a peak value for this maximum energy RT and is subsequently decreased proportionally. The AC value ceases to decrease at a certain energy EB2, with the AC value at this time being the minimum value. That is, the AC value exhibits peak characteristics for a given energy value.

Figure 14:
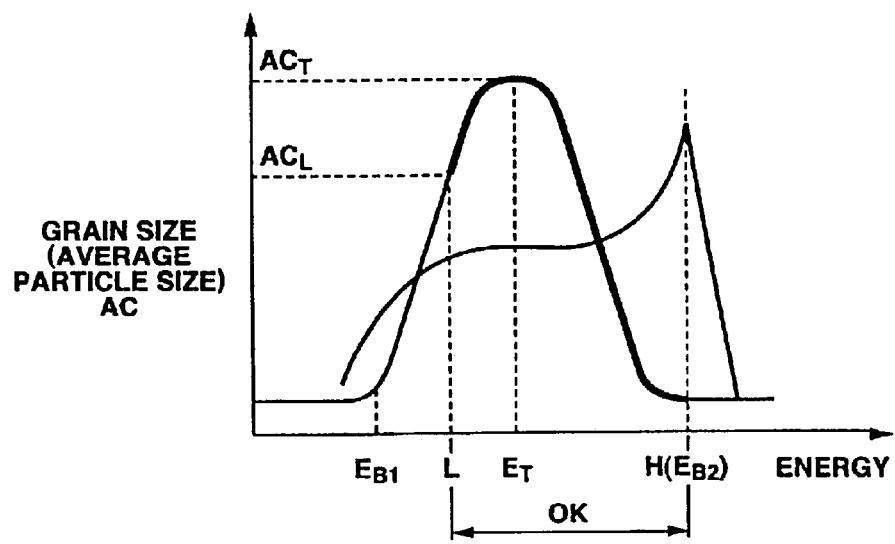
FIG. 14 illustrates AC values and the grain size for the energy applied to the polysilicon film.

If such peak characteristics of the AC value are superposed on grain size change characteristics of the polysilicon film shown in FIG. 3, the result is as shown in FIG. 14. As may be seen from FIG. 14, the maximum value in the graph, representing peak characteristics of AC values, is comprised in an energy range in which the grain size of the polysilicon film is optimum. Moreover, the energy $E_{B1}$, for which the AC value begins to be increased proportionally, is lower than the allowed minimum energy L for which the grain size accorded to the polysilicon film is optimum. On the other hand, the energy $E_{B2}$ for which the proportional decrease of the AC value ceases to reach the maximum value coincides with the allowed maximum energy which is the threshold energy value for which the crystal grains of the polysilicon film becomes micro-sized crystals.

So, for evaluating from the AC values having these peak characteristics whether or not the grain size of the polysilicon film is optimum, it suffices to check whether or not the AC value is comprised within the range indicated by a thick line in FIG. 14.

(4) If the AC value having such characteristics is evaluated to check whether or not the polysilicon film is acceptable, it is possible to decide that a substrate being inspected is acceptable if the AC value of the substrate is larger than a threshold value $AC_L$ as found when the AC value of the substrate being inspected is larger than the threshold value $AC_L$ as found on applying the allowed minimum energy L. Moreover, even if the AC value of the substrate being inspected is lower than the threshold value $AC_L$, the substrate may be determined to be acceptable if, by observing certain characteristics, the energy applied is higher than the energy $E_T$ for which the AC value is maximum.

If the AC value having such characteristics is evaluated to set the laser power from the excimer laser annealing device to an optimum value, plural substrates are laser-annealed as the laser power of the excimer laser is changed. The AC values associated with respective laser powers are plotted in a graph, specifically, a graph such as is shown in FIG. 13 is drawn, to find an optimum laser power from the graph.

In the bottom gate type TFT, in which the gate electrode 3 is formed below the polysilicon film 6, the polysilicon film 6 on the gate electrode 3 is higher than the polysilicon film 6 on the glass substrate 2 (on the source/drain area) in energy diffusion characteristics in case of laser annealing. So, even if the laser power applied from the excimer laser annealing device is the same, the energy applied to the portion of the polysilicon film 6 lying on the gate electrode 3 differs from that applied to the portion of the polysilicon film 6 lying on the glass substrate 2, that is on the source/drain area, with the result that the grain size differs in the two portions.

In general, if laser annealing is made by the excimer laser annealing device, it is not possible to manage control to change the laser power between the the portion of the polysilicon film 6 lying on the gate electrode 3 and to the portion of the polysilicon film 6 lying on the glass substrate 2, that is on the source/drain area, such that excimer laser annealing is performed evenly with the same power setting.

Figure 15:
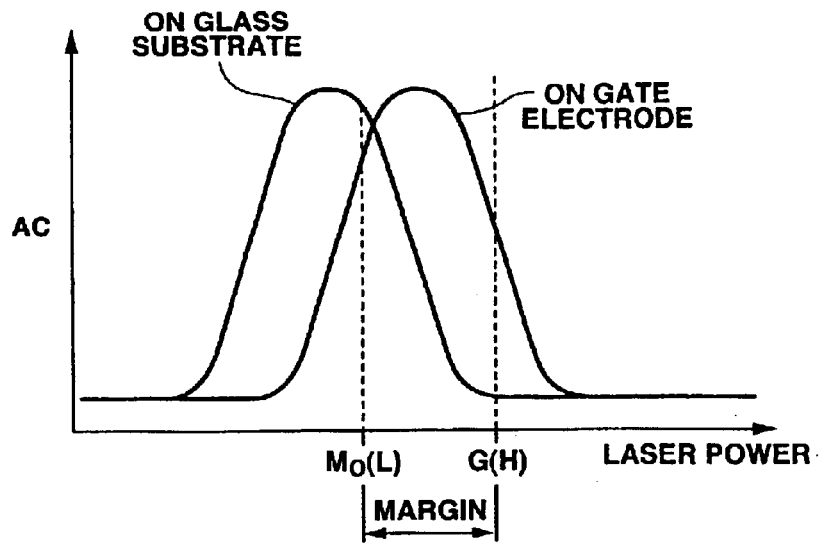
FIG. 15 illustrates AC values with respect to the laser power of the excimer laser in a bottom gate type TFT.

So, in the bottom gate type TFT, the relation between the AC value and the laser power of the excimer laser is as shown in FIG. 15, such that the peak value on the gate electrode, that is on the source/drain area, is at a different position from that on the gate electrode. Specifically, the AC value of the portion of the polysilicon film lying on the glass substrate, that is on the source/drain area, is at a peak at a laser power lower than that for the portion of the polysilicon film 6 lying on the gate electrode.

Therefore, if the AC value is evaluated to make the inspection as to whether or not the polysilicon film is acceptable, and if the AC value is evaluated to set the laser power radiated from the excimer laser annealing device to an optimum value, it is necessary to set the values of laser power which will optimize the two portions of the polysilicon film, that is the portion lying on the glass substrate and the portion lying on the gate electrode.

Figure 16:
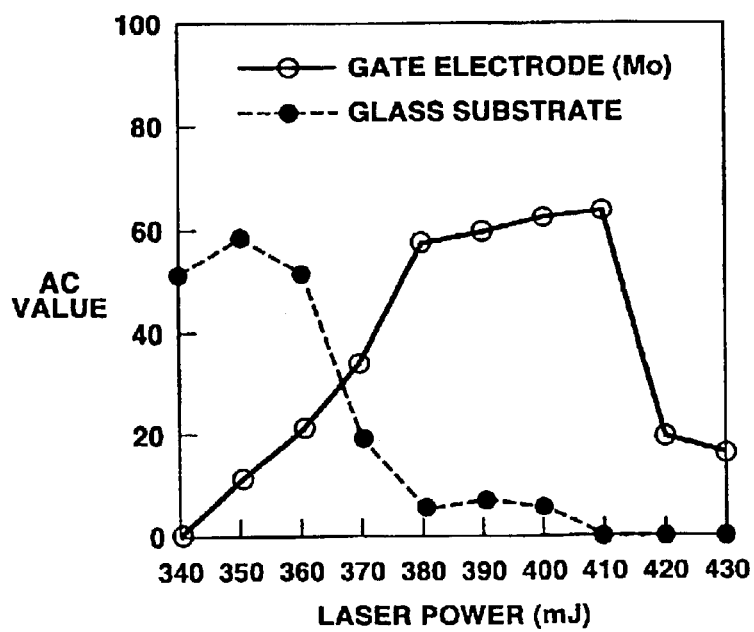
FIG. 16 illustrates typical experimental data of AC values with respect to the laser power of the excimer laser in a bottom gate type TFT.
Figure 17:
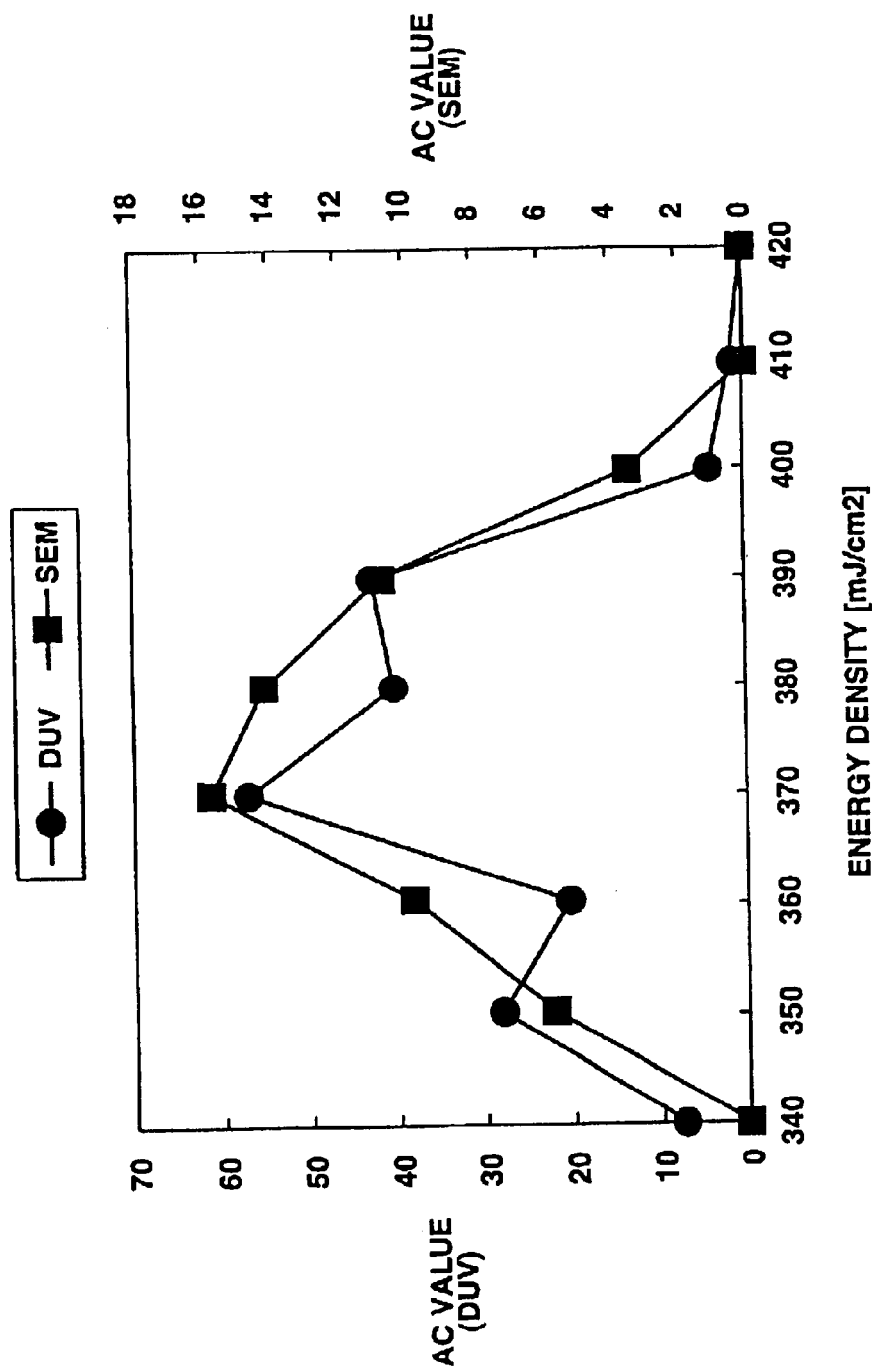
FIG. 17 illustrates AC values as found based on an image photographed with a microscopic device employing a UV laser (DUV) AC values as found based on an image photographed with SEM.

FIG. 16 shows illustrative specified experimental data of the AC values with respect to the laser power of the excimer laser. As may be seen from FIG. 16, the AC values are of such characteristics that there are two different peak values, that is the peak value on the gate electrode and the peak value on the glass substrate. From the graph of FIG. 16, it is seen that the laser power for excimer laser annealing is optimally set to 380 mJ.

(6) As discussed above, if, in evaluating the polysilicon film formed on the bottom gate type TFT, the linearity and/or the periodicity of the polysilicon film surface is evaluated, polysilicon can be inspected non-destructively, such that the inspection process can be built into the manufacturing process. Moreover, since the linearity and/or the periodicity is represented numerically, numerical calculations may be used in place of visual inspection. Also, since the evaluation is by numerical representation, automatic inspection becomes possible to assure subjective inspection at a high precision. In addition, the result of the inspection is fed back to the annealing processing step to improve the production yield of the thin-film transistor.

In the foregoing, a microscopic device employing a UV light laser is applied as the polysilicon imaging device. However, the device for photographing an original image usable for evaluating the linearity and/or periodicity of the polysilicon film is not limited to this microscopic device. For example, the linearity and/or periodicity of the surface spatial structure of the polysilicon film may be evaluated based on the picture as observed by SEM. For example, comparison of characteristics obtained when finding the AC value based on an image photographed by a microscopic device employing the UV laser light (DUV) to those obtained in finding the AC value based on the image photographed by SEM, reveals that, although an image with higher definition is obtained with the SEM and hence the AC value is relatively low in this case, the curves representing the characteristics are substantially the same.

Although the embodiment of using the autocorrelation function has been explained as a technique for numerical representation of the linearity and/or periodicity, the technique for numerical representation is also not limited to the embodiment of using the autocorrelation function.

Specified Application in Manufacturing Process of Bottom Gate Type TFT 1

In the following, an illustrative application of the polysilicon film evaluation apparatus 20 to the manufacturing process for the bottom gate type TFT is hereinafter explained.

Figure 18:
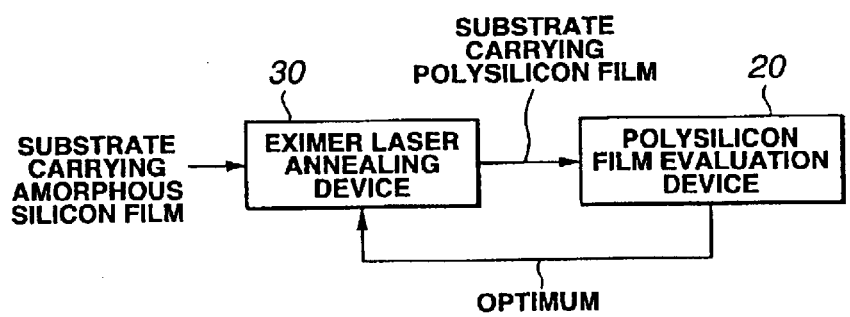
FIG. 18 illustrates the structure of a specified application (EQC) of a polysilicon film evaluation device to a production process of a bottom gate type TFT.
Figure 19:
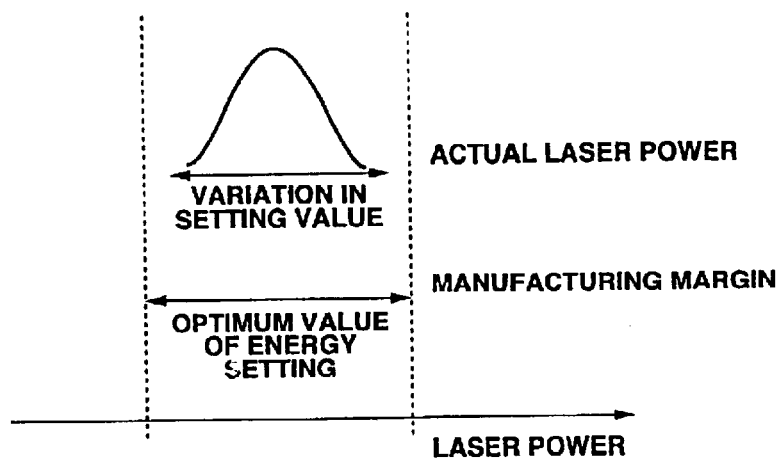
FIG. 19 illustrates the relation between the margin of preparation of the energy applied to the polysilicon film and variations in the excimer laser power in case the laser power is set to an optimum value.
Figure 20:
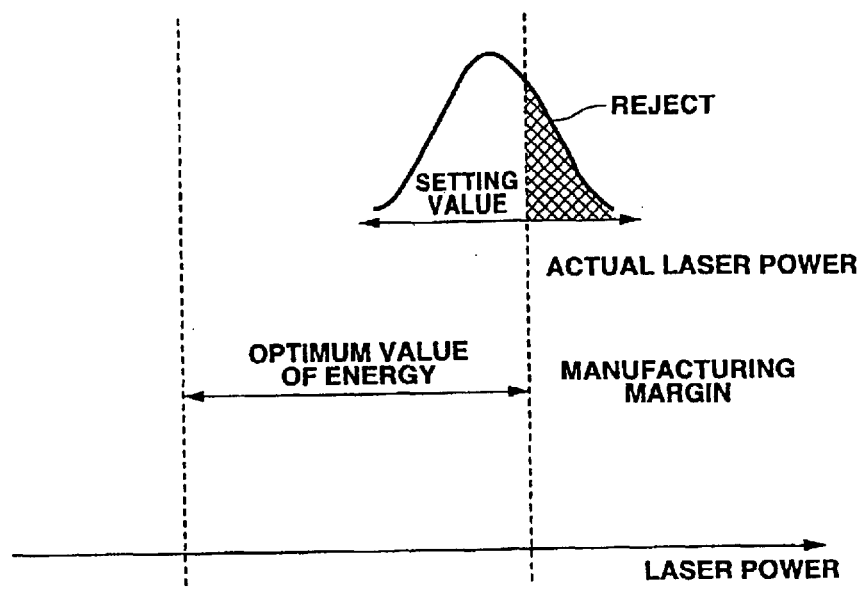
FIG. 20 illustrates the relation between the margin of preparation of the energy applied to the polysilicon film and variations in the excimer laser power in case the laser power is not set to an optimum value.

First, an illustrative application of evaluating the AC value obtained from an imaging surface of the polysilicon film of the bottom gate type TFT shown in FIG. 18 and feeding back the results of the evaluation to the lead to set the laser power from this excimer laser annealing device 30 to an optimum value (EQC; equipment quality control) is explained.

In the excimer laser annealing device, the output value of the actual laser power undergoes fluctuations with respect to the laser power setting value, as discussed above. The output laser power shows Gaussian characteristics of distribution such that certain fluctuations are produced with respect to the pre-set power setting. On the other hand, in the case of the bottom gate type TFT, the manufacturing margin of the energy afforded to the polysilicon film, that is an energy range outside which the product is a reject, is of a large value relative to the fluctuations.

So, if the center position of the manufacturing margin of the polysilicon film is an optimum value of the laser power setting, and the laser power is set to this optimum value, the energy afforded to the polysilicon film is within the manufacturing margin even if the laser power is fluctuated, thus giving a high production yield. However, if the laser power setting is not to an optimum setting of the manufacturing margin, the energy afforded to the polysilicon film is sometimes off the manufacturing margin, thus lowering the production yield.

Therefore, in the present embodiment, the laser power of the excimer laser annealing device is set to an optimum value by exploiting peak properties of the AC value of the bottom gate type TFT as follows:

First, in the present embodiment, plural substrates, each carrying a polysilicon film, are produced. In this case, the setting of the laser power of the excimer laser annealing device is changed from substrate to substrate and an AC value on the gate electrode and that on the glass substrate are found for each substrate.

Figure 21:
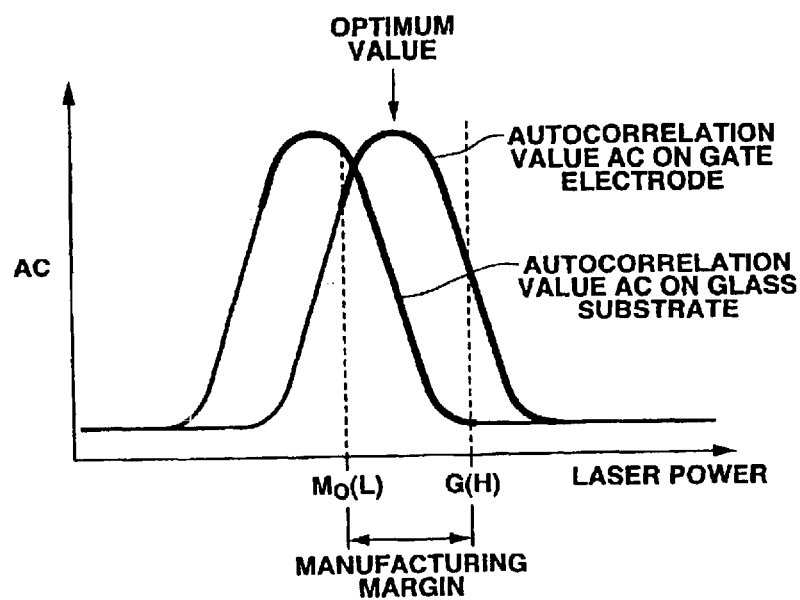
FIG. 21 illustrates a typical relation between the margin of production of a bottom gate type TFT and the laser power and a method for finding the optimum value of the laser power from this typical relation.
Figure 22:
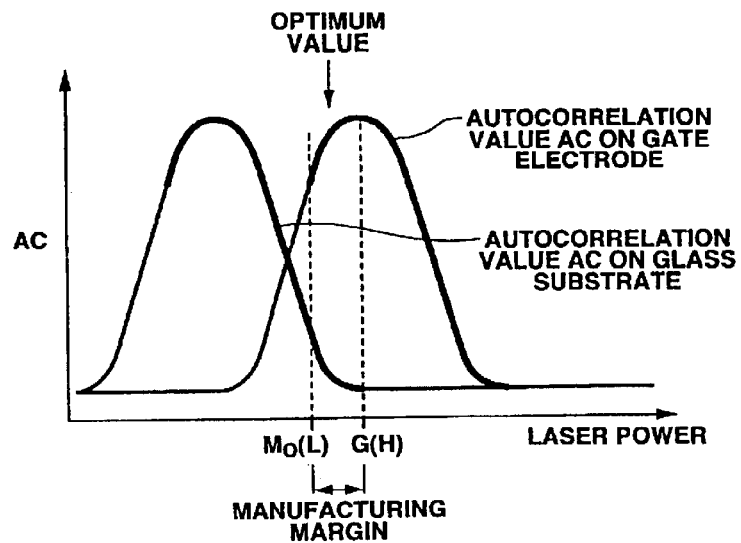
FIG. 22 illustrates another typical relation between the margin of production of a bottom gate type TFT and the laser power and a method for finding the optimum value of the laser power from this typical relation.

Then, AC value peaks, as shown in FIGS. 21 and 22, are drawn on graphs.

If the AC peak value curves are drawn as described above, it is possible to find the allowable ranges of the laser power (manufacturing margin of the polysilicon film) which will give an optimum grain size for both the portions of the polysilicon film lying on the gate electrode and on the glass substrate. Specifically, the laser power on the lower limit threshold of the manufacturing margin is the laser power corresponding to the minimum allowed energy (L) afforded to the polysilicon film on the gate electrode, specifically, the laser power on the left end of the AC value portion drawn with a thick line on the gate electrode indicated in FIGS. 21 and 22 (MO(L)). On the other hand, the the laser power on the upper limit threshold of the manufacturing margin is the laser power corresponding to the maximum allowed energy (H) afforded to the polysilicon film on the gate electrode, specifically, the laser power on the right end of the AC value portion drawn with a thick line on the glass substrate indicated in FIGS. 21 and 22 (G(H)).

A median value of the manufacturing margin, thus found, is found, and the laser power for this median value is set as an optimum value.

The AC value is found as described above to find the manufacturing margin, which is then set as an optimum value to increase the yield of the bottom gate type TFT.

Figure 23:
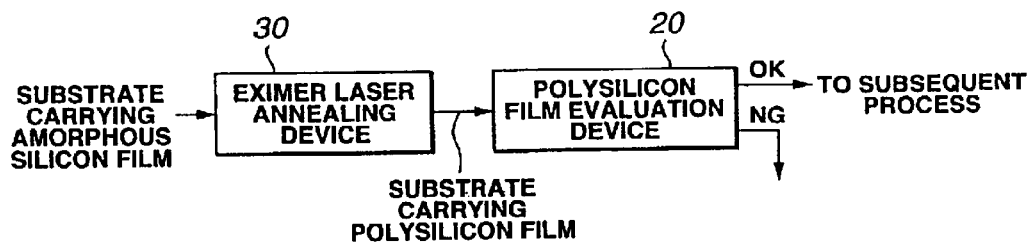
FIG. 23 shows the structure of a specified application (IPQC) in which a polysilicon film evaluation device is applied to a production process of the bottom gate type TFT.

An illustrative application in which the AC value obtained from the photographed image of the polysilicon film of the bottom gate type TFT, manufactured by the excimer laser annealing device 30, as shown in FIG. 23, is evaluated, and the result of evaluation is used in giving the decision of the acceptability of the polysilicon film (IPOC, In-Process Quality Control), is hereinafter explained.

In the excimer laser annealing device, the output value of the actual laser power undergoes larger fluctuations with respect to the laser power setting, as discussed above. So, with the polysilicon film evaluation apparatus 20, the decision as to acceptability is given on the basis of 100% or approximately 100% inspection so as not to transfer the flaw in the excimer laser annealing process to subsequent processes.

Specifically, the polysilicon film evaluation apparatus 20 gives the decision as to acceptability as follows:

In the bottom gate type TFT, acceptability may be achieved in case laser annealing is performed in a range from the allowed minimum energy L of the energy applied to the portion of the polysilicon film lying on the gate electrode to the laser power corresponding to the allowed maximum energy H applied to the portion of the polysilicon film lying on the glass substrate. Specifically, this range begins at the laser power at the left end of the AC value curve on the gate electrode drawn with a thick line and terminates at the laser power at the right end of the AC value curve on the glass substrate drawn with a thick line. That is, if the polysilicon film is annealed with the laser power comprised in the ranges ③ and ④ in FIG. 24, the polysilicon film is acceptable.

So, the polysilicon film evaluation apparatus 20 first finds the AC value on the portion of the polysilicon film lying on the gate electrode. The polysilicon film evaluation apparatus 20 then checks whether or not this AC value is larger than the threshold value $AC_L(MO)$ as found when the allowed minimum energy L is applied to the polysilicon film. If the AC value is larger than the threshold value $AC_L(MO)$, the laser power is within the range ③ in FIG. 24, and hence the polysilicon film is verified to be acceptable.

If the AC value is smaller than the threshold value $AC_L$, the following decision is given. The autocorrelation value when the polysilicon film portion on the gate electrode is annealed with the laser power corresponding to the allowed maximum energy H afforded to the polysilicon film on the glass substrate is set as being the threshold value $AC_B$. It is then checked whether or not the AC value of the polysilicon film portion lying on the gate electrode is within a range from threshold value $AC_L$ to threshold value $AC_B$ and also whether or not the AC value of the polysilicon film portion lying on the glass substrate is lower than the threshold value $AC_B$. If this condition is met, the laser power is within the range ④ in FIG. 24 and hence the polysilicon film is verified to be acceptable. If the above condition is not met, the laser power is within the ranges of ①, ② and ⑤ in FIG. 24 and hence the polysilicon film is verified to be a reject.

By finding the AC value of the polysilicon film portions lying on the gate electrode and on the glass substrate, it is possible to check the acceptability of the polysilicon film by exploiting the different in characteristics of the autocorrelation value of the polysilicon film portions lying on the gate electrode and on the glass substrate, thereby relieving the load imposed on the processing downstream of the laser annealing step.

Figures 24, 25A, 25B:
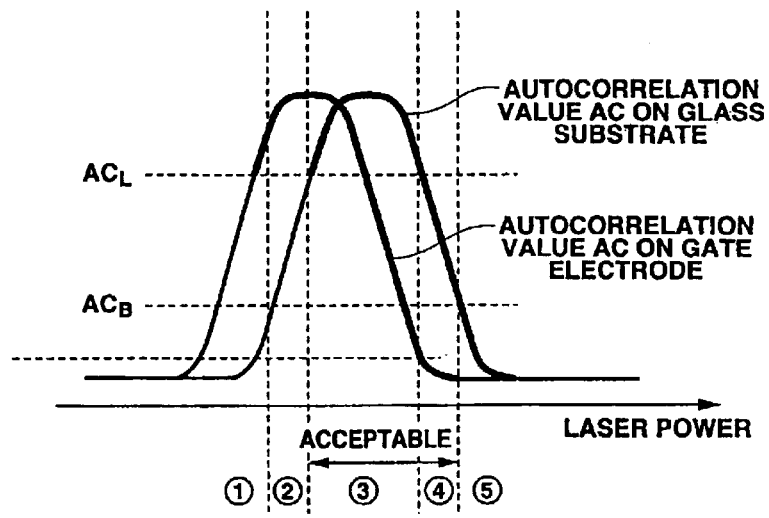
FIG. 24 illustrates a method for verifying, from the AC value of the bottom gate type TFT whether or not the polysilicon film is acceptable.

Even if plural LCDs are formed on a sole glass substrate, as shown in FIGS. 25A and 25B, the reject positions can be located by carrying out 100%-inspection on the LCDs, even on the occasion of occurrence of partial flaws, thereby relieving the load otherwise imposed on the downstream side processing.

What is claimed is:

1. A method for preparation of a thin-film transistor, comprising the steps of:
   forming an amorphous silicon film;
   annealing the formed amorphous silicon film to form a polysilicon film; and
   evaluating a linearity and/or periodicity of a spatial structure of a film surface of the polysilicon film to evaluate a state of the polysilicon film based on result of evaluation of linearity and/or periodicity;
   wherein, in said evaluating step, a surface image of the polysilicon film is photographed and an autocorrelation of the surface image is found to evaluate the linearity and/or periodicity of the spatial structure of the film surface.

2. A method for preparation of a thin-film transistor, comprising the steps of:
   forming an amorphous silicon film;
   annealing the formed amorphous silicon film to form a polysilicon film; and
   evaluating a linearity and/or periodicity of a spatial structure of a film surface of the polysilicon film to evaluate a state of the polysilicon film based on a result of evaluation of linearity and/or periodicity;
   wherein, in said evaluating step, a UV laser is illuminated on said polysilicon film to photograph a surface image of said polysilicon film to perform evaluation based on the photographed surface image.

3. A method for preparation of a thin-film transistor having a step of forming a polysilicon film serving as a channel layer by laser annealing an amorphous silicon film by an excimer laser annealing device, comprising the steps of:
   forming a gate electrode on a substrate;
   forming an amorphous silicon film on the substrate on which said gate electrode has been formed;
   laser annealing said amorphous silicon films on plural substrates or plural locations of said amorphous silicon film on a sole substrate to form a polysilicon film;
   evaluating the linearity and/or periodicity of a spatial structure of a surface of said polysilicon film formed on the gate electrode on said substrate;
   evaluating the linearity and/or periodicity of the spatial structure of the surface of said polysilicon film formed on locations other than the gate electrode on said substrate;
   calculating the manufacturing margin of said polysilicon film in the laser annealing based on the linearity and/or periodicity of said spatial structure of the polysilicon film surface formed on said gate electrode and on the linearity and/or periodicity of the polysilicon film surface formed on a location other than said gate electrode; and
   setting the laser power of said excimer laser annealing device based on said manufacturing margin.

4. A method for preparation of a thin-film transistor of a bottom gate structure in which a gate electrode is formed between a substrate and a polysilicon film, comprising the steps of:
   forming a gate electrode on said substrate;
   forming an amorphous silicon film on said substrate on which said gate electrode has been formed;
   laser annealing said amorphous silicon film to form a polysilicon film; and
   checking the acceptability of said polysilicon film based on a spatial structure of the surface of said polysilicon film;
   said checking step comprising:
   evaluating the linearity and/or periodicity of the spatial structure of the surface of said polysilicon film formed on said gate electrode of each substrate;
   evaluating the linearity and/or periodicity of tile spatial structure of the surface of said polysilicon film formed on a location other than said gate electrode of each substrate; and checking the acceptability of said polysilicon film based on the linearity and/or periodicity of the spatial structure of the surface of said polysilicon film formed on said gate electrode or on the linearity and/or periodicity of the spatial structure of the surface of said polysilicon film formed on a location other than said gate electrode.

* * * * *